United States Patent
Uehara et al.

(10) Patent No.: US 10,483,966 B2
(45) Date of Patent: Nov. 19, 2019

(54) SWITCHING CIRCUIT

(71) Applicant: PANASONIC INTELLECTUAL PROPERTY MANAGEMENT CO., LTD., Osaka (JP)

(72) Inventors: Takahiro Uehara, Kyoto (JP); Takuya Ishii, Osaka (JP); Hiroyuki Handa, Osaka (JP); Atsushi Kitagawa, Mie (JP); Takeshi Tanaka, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/226,081

(22) Filed: Dec. 19, 2018

(65) Prior Publication Data

US 2019/0149148 A1    May 16, 2019

Related U.S. Application Data

(60) Division of application No. 15/925,104, filed on Mar. 19, 2018, now Pat. No. 10,205,449, which is a (Continued)

(30) Foreign Application Priority Data

Aug. 31, 2016    (JP) .................................. 2016-170127

(51) Int. Cl.
  *H03K 17/64*   (2006.01)
  *H03K 17/12*   (2006.01)
  *H02M 1/00*    (2006.01)

(52) U.S. Cl.
  CPC ............ *H03K 17/64* (2013.01); *H03K 17/122* (2013.01); *H03K 17/127* (2013.01); *H02M 2001/0009* (2013.01)

(58) Field of Classification Search
  CPC ........ H03K 17/10; H03K 17/102; H03K 17/12; H03K 17/122; H03K 17/16; H03K 17/161;
  (Continued)

(56) References Cited

U.S. PATENT DOCUMENTS

| 5,804,859 A * | 9/1998 | Takahashi ............... H01L 24/49 257/355 |
| 8,351,231 B2 | 1/2013 | Tagome |
| 8,847,656 B1 * | 9/2014 | A ..................... H03K 17/08122 327/310 |
| 9,041,457 B2 | 5/2015 | Miyachi et al. |

(Continued)

FOREIGN PATENT DOCUMENTS

| EP | 1 079 434 A2 | 2/2001 |
| JP | 08-126331 A | 5/1996 |

(Continued)

OTHER PUBLICATIONS

International Search Report and Written Opinion issued in International Patent Application No. PCT/JP2017/028517, dated Sep. 26, 2017; with partial English translation.

(Continued)

*Primary Examiner* — Nguyen Tran
(74) *Attorney, Agent, or Firm* — McDermott Will & Emery LLP

(57) ABSTRACT

A switching circuit includes: a drive power supply; a first transistor and a second transistor; a drive signal source; and a drive circuit. Each of the first transistor and the second transistor includes: a drain electrode and a source electrode in which a main current flows when a corresponding one of the first transistor and the second transistor is ON; a first source terminal for passing the main current; and a second source terminal. Here, the first source terminal is connected to the source electrode at an impedance lower than an impedance of the second source terminal.

8 Claims, 8 Drawing Sheets

Related U.S. Application Data continuation of application No. PCT/JP2017/028517, filed on Aug. 7, 2017.

(58) Field of Classification Search
CPC .... H03K 17/30; H03K 17/302; H03K 19/003; H03K 19/00307; H03K 19/00315; H03K 19/00346; H03K 19/00353; H03K 19/00361; H03K 17/107; H03K 17/127; H03K 17/56; H03K 17/567; H03K 17/60; H03K 17/687; H03K 17/6871; H03K 17/601; H03K 17/64; H03K 17/691; H03K 17/731; H03K 3/012; H03K 17/164; H03K 17/668; H03K 19/0013; H03K 19/018521; H04L 25/026; G11B 5/02; G11B 5/022
USPC .................. 327/108–112, 427, 434, 436
See application file for complete search history.

(56) References Cited

U.S. PATENT DOCUMENTS

| | | | |
|---|---|---|---|
| 9,331,061 B2 | 5/2016 | De Rooij et al. | |
| 9,484,908 B1* | 11/2016 | Lu | H03K 17/133 |
| 2004/0036511 A1 | 2/2004 | Otoshi et al. | |

FOREIGN PATENT DOCUMENTS

| | | |
|---|---|---|
| JP | 08-162935 A | 6/1996 |
| JP | 09-289442 A | 11/1997 |
| JP | 10-23744 A | 1/1998 |
| JP | 10-155272 A | 6/1998 |
| JP | 2001-068498 A | 3/2001 |
| JP | 4288702 B2 | 7/2009 |

OTHER PUBLICATIONS

Notice of Allowance issued in U.S. Appl. No. 15/925,104, dated Sep. 27, 2018.

* cited by examiner

SWITCHING CIRCUIT

CROSS REFERENCE TO RELATED APPLICATIONS

This application is a Divisional application of U.S. patent application Ser. No. 15/925,104, filed on Mar. 19, 2018, now U.S. Pat. No. 10,205,449, which is a continuation application of PCT International Patent Application Number PCT/JP2017/028517 filed on Aug. 7, 2017, claiming the benefit of priority of Japanese Patent Application Number 2016-170127 filed on Aug. 31, 2016, the entire contents of which are hereby incorporated by reference.

BACKGROUND

1. Technical Field

The present disclosure relates to a switching circuit including switching elements connected in parallel and a drive circuit for the switching elements.

2. Description of the Related Art

There are demands for development of switching circuits which can facilitate high frequency switching because it is possible to reduce the dimensions of LC components by increasing the switching frequency of an electric power converter represented by a switching power supply and an inverter. On the other hand, when a switching current exceeds a rated current of one switching transistor, transistors are connected in parallel. One object to be solved when driving transistors in parallel is to balance main currents that flow into the respective transistors.

FIG. 10 is a circuit diagram of a switching circuit disclosed in Patent Literature 1 (Japanese Unexamined Patent Application Publication No. 9-289442). The currents that flow into the respective transistors are balanced using IGBTs with current sense emitters as transistors connected in parallel. In FIG. 10, the main currents that flow into emitters of respective IGBTs 131 and 132 are detected by voltages of sense resistors 161 and 162 connected to the current sense emitters. Operational amplifiers 151 and 152 compare a voltage difference between sense resistors 161 and 162, that is, the main currents of respective IGBTs 131 and 132. If the current of IGBT 131 is large, operational amplifier 151 controls FET 141 to be at an ON side to lower the gate voltage of IGBT 131, so as to decrease the main current. In addition, operational amplifier 152 controls FET 142 to be at an OFF side to raise the gate voltage of IGBT 132, so as to increase the main current. In this way, the currents of IGBTs 131 and 132 are balanced.

SUMMARY

However, the switching circuit configured as described above needs to detect main currents of respective transistors, which increases the circuit dimensions for detection processing of the main currents. In addition, a method for feeding the result of the current detection back to a drive circuit produces delay time, which causes a problem that it is difficult to balance main currents, for example, at the time of transition between turn on and turn off of a transistor and when a switching frequency is changed to a high frequency.

The present disclosure was provided in view of the above problem, and has an object to provide a switching circuit which is simply configured, based on an embodiment, to include high-speed switching transistors connected in parallel and be capable of balancing main currents that flow to the high-speed switching transistors.

In order to solve the above problem, a switching circuit according to an aspect of the present disclosure is a switching circuit including: a drive power supply which includes a positive electrode terminal and a negative electrode terminal, and outputs a predetermined drive voltage; a first transistor and a second transistor which are connected in parallel; a drive signal source which outputs a drive pulse signal for turning on and off the first transistor and the second transistor; and a drive circuit which includes a power supply terminal and a ground terminal, receives supply of electric power from the drive power supply, and outputs, according to the drive pulse signal, a first drive signal for turning on and off the first transistor and a second drive signal for turning on and off the second transistor, wherein each of the first transistor and the second transistor includes: a drain electrode and a source electrode in which a main current flows when a corresponding one of the first transistor and the second transistor is ON; a gate electrode which changes an impedance between the drain electrode and the source electrode according to a corresponding one of the first drive signal and the second drive signal; a gate terminal connected to the gate electrode; a drain terminal connected to the drain electrode; a first source terminal connected to the source electrode for passing the main current between the drain electrode and the source electrode; and a second source terminal connected to the source electrode for detecting a source voltage and flowing a gate drive current, the second source terminal being different from the first source terminal, the first source terminal is connected to the source electrode at an impedance lower than an impedance of the second source terminal, the drain terminal of the first transistor and the drain terminal of the second transistor are connected to each other, the first source terminal of the first transistor and the first source terminal of the second transistor are connected to each other, the gate terminal of the first transistor receives the first drive signal, the gate terminal of the second transistor receives the second drive signal, and the second source terminal of the first transistor and the second source terminal of the second transistor are connected at a portion at which the negative electrode terminal of the drive power supply and the ground terminal of the drive circuit are connected.

With this configuration, it is possible to prevent malfunction by removing the influence of a source parasitic inductance to which a main current flows, and further adjust or balance a parasitic inductance of each of drive loops by division in a drive source path.

In addition, the first transistor and the second transistor may have substantially equal rated currents, and the first drive signal and the second drive signal which are supplied by the drive circuit may be set to be substantially the same.

In this way, it is possible to substantially double the rated current of each transistor.

A switching circuit according to an aspect of the present disclosure is a switching circuit including: a drive power supply which includes a positive electrode terminal and a negative electrode terminal, and outputs a predetermined drive voltage; a first transistor and a second transistor which are connected in parallel; a drive signal source which outputs a drive pulse signal for turning on and off the first transistor and the second transistor; and a drive circuit which receives supply of electric power from the drive power supply, and outputs, according to the drive pulse signal, a first drive signal for turning on and off the first transistor and a second drive signal for turning on and off the second transistor, wherein each of the first transistor and the second transistor includes: a drain terminal and a source terminal in which a main current flows when a corresponding one of the first transistor and the second transistor is ON; and a gate terminal which changes an impedance between the drain terminal and the source terminal according to a corresponding one of the first drive signal and the second drive signal, the drain terminal of the first transistor and the drain terminal of the second transistor are connected to each other, the source terminal of the first transistor and the source terminal of the second transistor are connected to each other, the gate terminal of the first transistor receives the first drive signal, the gate terminal of the second transistor receives the second drive signal, and the drive circuit includes: a first ON circuit which supplies a first ON drive current as part of the first drive signal during a period for which the drive pulse signal instructs an ON state of the first transistor and the second transistor, the first ON drive current being a predetermined direct current from the positive electrode terminal of the drive power supply to the gate terminal of the first transistor; a second ON circuit which supplies a second ON drive current as part of the second drive signal during a period for which the drive pulse signal instructs an ON state of the first transistor and the second transistor, the second ON drive current being a predetermined direct current from the positive electrode terminal of the drive power supply to the gate terminal of the second transistor; a first turn-ON circuit which supplies a first predetermined turn-ON drive current as part of the first drive signal when the drive pulse signal instructs turning on of the first transistor and the second transistor, the first predetermined turn-ON drive current being supplied from the positive electrode terminal of the drive power supply to the gate terminal of the first transistor; a second turn-ON circuit which supplies a second predetermined turn-ON drive current as part of the second drive signal when the drive pulse signal instructs turning on of the first transistor and the second transistor, the second predetermined turn-ON drive current being supplied from the positive electrode terminal of the drive power supply to the gate terminal of the second transistor; a first turn-OFF circuit which draws, as part of the first drive signal, a first predetermined turn-OFF drive current from the gate terminal of the first transistor when the drive pulse signal instructs turning off of the first transistor and the second transistor; and a second turn-OFF circuit which draws, as part of the second drive signal, a second predetermined turn-OFF drive current from the gate terminal of the second transistor when the drive pulse signal instructs turning off of the first transistor and the second transistor.

In this way, it is possible to adjust and balance the main currents by adjusting respective drive conditions.

In addition, the first transistor and the second transistor may require a current to be supplied to the gate terminal in order to be kept in the ON state.

In this way, it is possible to provide the switching circuit having high-speed low-loss switching characteristics.

In addition, the first transistor and the second transistor may have a substantially equal rated current, in the drive circuit, a first ON drive current supplied by the first ON circuit and a second ON drive current supplied by the second ON circuit may be set to be substantially equal to each other, the turn-ON drive current supplied by the first turn-ON circuit and the turn-ON drive current supplied by the second turn-ON circuit may be set to be substantially equal to each other, and the first turn-OFF drive current supplied by the first turn-OFF circuit and the second turn-OFF drive current supplied by the second turn-OFF circuit may be set to be substantially equal to each other.

In this way, it is possible to substantially double the rated current of the transistor.

In addition, the first ON circuit and the second ON circuit may share a first switch which turns on when the drive pulse signal instructs an ON state of the first transistor and the second transistor, the first ON circuit may include a series circuit including the first switch and a first ON drive resistor, and the second ON circuit may include a series circuit including the first switch and a second ON drive resistor.

In this way, the series circuit including the first switch and the first ON drive resistor generates the first ON drive current to be supplied to the gate terminal of the first transistor. In addition, the series circuit including the first switch and the second ON drive resistor generates the second ON drive current to be supplied to the gate terminal of the second transistor. Furthermore, it is possible to adjust or approximate the ON resistances of the first transistor and the second transistor by the first ON drive resistor and the second ON drive resistor.

In addition, the first turn-ON circuit and the second turn-ON circuit may share a second switch which turns on when the drive pulse signal instructs an ON state of the first transistor and the second transistor, the first turn-ON circuit may include a series circuit including the second switch and a first capacitor, and the second turn-ON circuit may include a series circuit including the second switch and a second capacitor.

In this way, the series circuit including the second switch and the first capacitor generates the first turn-ON drive current to be supplied to the gate terminal of the first transistor. In addition, the series circuit of the second switch and the second capacitor generates the second turn-ON drive current to be supplied to the gate terminal of the second transistor. Furthermore, it is possible to adjust or approximate the turn-ON characteristics (speed) of the first transistor and the second transistor by the first capacitor and the second capacitor.

In addition, the first turn-OFF circuit and the second turn-OFF circuit may be connected to the negative electrode terminal of the drive power supply, and may share a third switch which turns on when the drive pulse signal instructs an OFF state of the first transistor and the second transistor, and the first turn-OFF circuit may include a series circuit including the third switch and a first diode, and the second turn-OFF circuit may include a series circuit including the third switch and a second diode.

In this way, the series circuit including the third switch and the first diode generates the first turn-OFF drive current to be supplied to the gate terminal of the first transistor. In addition, the series circuit including the third switch and the second diode generates the first turn-OFF drive current to be supplied to the gate terminal of the first transistor. It is possible to prevent, using diodes, an inter-transistor feedback current from occurring at the time of turning off each transistor.

In addition, the drive circuit may include a negative drive power supply which outputs a negative voltage having a polarity opposite to a polarity of the drive voltage, the first turn-OFF circuit and the second turn-OFF circuit may be connected to the negative drive power supply, and may share a third switch which turns on when the drive pulse signal instructs an OFF state of the first transistor and the second transistor, the first turn-OFF circuit may include a series circuit including the negative drive power supply, the third switch, and a first diode, and the second turn-OFF circuit may include a series circuit including the negative drive power supply, the third switch, and a second diode.

In this way, it is possible to prevent, using the first diode and the second diode, an inter-transistor feedback current of the first transistor and the second transistor from occurring at the time of turning off each of the first and second transistors, prevent an erroneous ignition due to a negative bias of the negative drive power supply, and enhance turn-OFF characteristics.

In addition, the switching circuit may further include: a bypass capacitor which becomes an alternating current source for the first transistor and the second transistor, wherein the bypass capacitor, the first transistor, and the second transistor may be connected for passing the main current from a load to a negative electrode terminal of the bypass capacitor through the first transistor and the second transistor, and the first transistor, the second transistor, and the bypass capacitor may be arranged on a wiring board such that an impedance between the first source terminal of the first transistor and the negative electrode terminal of the bypass capacitor and an impedance between the first source terminal of the second transistor and the negative electrode terminal of the bypass capacitor are substantially equal to each other.

In this way, it is possible to perform a parallel switching operation in which currents at the time of transition of the switching circuit mounted on the wiring board are balanced.

In addition, the first transistor, the second transistor, and the bypass capacitor may be arranged on the wiring board such that a perpendicular bisector of a line segment to connect the source terminal of the first transistor and the source terminal of the second transistor passes through the negative electrode terminal of the bypass capacitor in a plan view of the wiring board.

In this way, it is possible to perform a parallel switching operation in which currents at the time of transition of the switching circuit mounted on the wiring board are balanced.

In addition, the switching circuit may further include: a third transistor and a fourth transistor, wherein each of the third transistor and the fourth transistor may include a drain terminal and a source terminal in which a main current flows, on the wiring board, the drain terminal of the third transistor, the drain terminal of the fourth transistor, and a positive electrode terminal of the bypass capacitor may be connected to one another, the drain terminal of the first transistor, the drain terminal of the second transistor, the source terminal of the third transistor, and the source terminal of the fourth transistor may be connected to one another, and the third transistor, the fourth transistor, and the bypass capacitor may be arranged on the wiring board such that a perpendicular bisector of a line segment to connect the drain terminal of the third transistor and the drain terminal of the fourth transistor passes through the positive electrode terminal of the bypass capacitor in a plan view of the wiring board.

In this way, it is possible to perform a parallel switching operation in which the currents at the time of transition of the switching circuit having a half bridge configuration mounted on the wiring board are balanced.

In addition, the switching circuit may further include: the wiring board; a first connector connected to the source terminal of the first transistor in a proximity of the first transistor arranged on the wiring board; a second connector connected to the source terminal of the second transistor in a proximity of the second transistor arranged on the wiring board; and a sub wiring board which is connected to the wiring board by the first connector and the second connector on the first transistor and the second transistor, and on which the bypass capacitor is arranged, wherein the first connector, the second connector, and the bypass capacitor may be arranged on the wiring board such that a perpendicular bisector of a line segment to connect the first connector and the second connector passes through the negative electrode terminal of the bypass capacitor in a plan view of the wiring board.

In this way, it is possible to provide the switching circuit which can be densely mounted in a solid configuration, in addition to the parallel operation in which the currents are balanced.

In addition, the switching circuit may further include: a third transistor and a fourth transistor, wherein each of the third transistor and the fourth transistor may include a drain terminal and a source terminal in which a main current flows, the switching circuit may further include: a third connector connected to the drain terminal of the third transistor in a proximity of the third transistor arranged on the wiring board; and a fourth connector connected to the drain terminal of the fourth transistor in a proximity of the fourth transistor arranged on the wiring board, wherein the third connector and the fourth connector may be connected to the sub wiring board, and the third connector, the fourth connector, and the bypass capacitor may be arranged on the sub wiring board such that a perpendicular bisector of a line segment to connect the third connector and the fourth connector passes through the positive electrode terminal of the bypass capacitor in a plan view of the sub wiring board.

In this way, it is possible to provide the switching circuit which can be densely mounted in a solid configuration, in addition to the parallel operation in which the currents are balanced.

In addition, the sub wiring board may also function as a heat sink for the first transistor and the second transistor.

In addition, it is possible to reduce increase in the temperatures of the transistors, and provide the switching circuit which can handle a larger current or has a longer life.

According to the present disclosure, it is possible to provide the switching circuit which is simply configured, based on an embodiment, to include high-speed switching transistors connected in parallel and be capable of balancing main currents that flow to the high-speed switching transistors.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Hereinafter, a switching circuit according to an embodiment of the present disclosure will be described with reference to the drawings. Each of the exemplary embodiments described below illustrates a specific example of the present disclosure. The numerical values, shapes, materials, constituent elements, the arrangement and connection of the constituent elements, indicated in the following exemplary embodiments are mere examples, and therefore do not limit the scope of the present disclosure.

Embodiment 1

Figure 1:
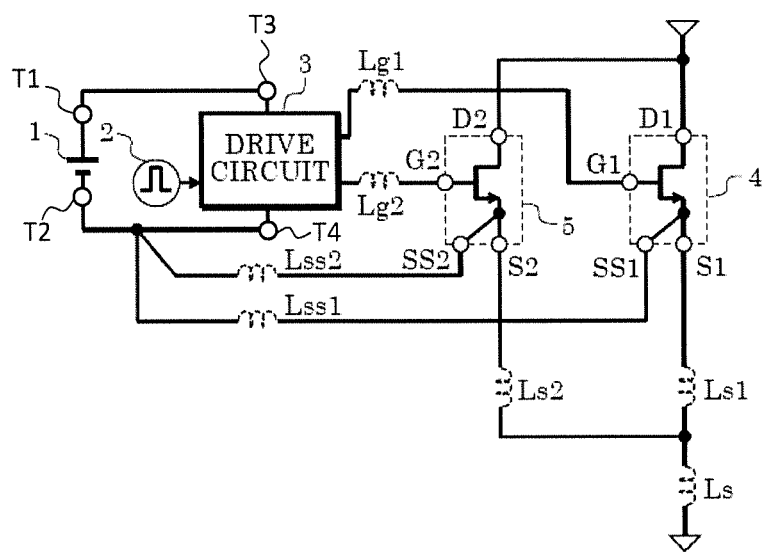
FIG. 1 is a diagram illustrating an example of a configuration of a switching circuit according to Embodiment 1.

FIG. 1 is a diagram illustrating an example of a configuration of a switching circuit according to Embodiment 1. The switching circuit illustrated in the diagram includes: drive power supply 1; drive signal source 2; drive circuit 3; first transistor 4; and second transistor 5.

In FIG. 1, first transistor 4 embeds a semiconductor chip including a gate electrode, a drain electrode, and a source electrode, and includes drain terminal D1 which is connected to the drain electrode, gate terminal G1 which is connected to the gate electrode, and first source terminal S1 and second source terminal SS1 which are connected to the source electrode. Second transistor 5 embeds a semiconductor chip including a gate electrode, a drain electrode, and a source electrode, and includes drain terminal D2 which is connected to the drain electrode, gate terminal G2 which is connected to the gate electrode, and first source terminal S2 and second source terminal SS2 which are connected to the source electrode. In order to supply a main current, first source terminal S1 is connected to the source electrode by, for example, using a plurality of bonding wires at a low impedance lower than the impedance of second source terminal SS1.

Likewise, in order to supply a main current, second source terminal S2 is connected to the source electrode by, for example, using a plurality of bonding wires at a low impedance lower than the impedance of second source terminal SS2.

Drive circuit 3, which has a power supply terminal T3 connected to a positive electrode terminal T1 of the drive power supply 1, receives supply of drive voltage Vcc from drive power supply 1 and outputs a first drive signal and a second drive signal according to drive pulse signal Vpls from drive signal source 2 to gate terminal G1 of first transistor 4 and gate terminal G2 of second transistor 5, respectively. Drain terminal D1 of first transistor 4 and drain terminal D2 of second transistor 5 are connected. First source terminal S1 of first transistor 4 and second source terminal S2 of second transistor 5 are connected. Main currents of first transistor 4 and second transistor 5 each of which has been placed into an ON state according to the first drive signal and the second drive signal flow from drain terminals D1 and D2 to first source terminals S1 and S2, respectively. First source terminals S1 and S2 in which the main currents flow and second source terminals SS1 and SS2 branched at the source electrode are connected at connection portions between the negative electrode terminal T2 of drive power supply 1 and the ground terminal T4 of drive circuit 3. For this reason, only gate currents accompanied by the first and second drive signals flow to second source terminals SS1 and SS2, and the main currents do not flow thereto.

FIG. 1 illustrates: inductances Lg1 and Lg2 as representatives of parasitic impedances present in respective gate drive paths; and inductances Ls1, Ls2, Ls, Lss1, and Lss2 as representatives of parasitic impedances present in respective source paths. If second source terminals SS1 and SS2 are not branched at the source electrode, main currents flow to parasitic inductances Ls1, Ls2, and Ls on the source paths and induce voltages, and the voltages are superimposed on the gate drive voltages. This causes unbalance of drive conditions. Since second source terminals SS1 and SS2 are branched at the source electrode in the switching circuit according to this embodiment, the main currents are divided from the gate drive currents and thus do not affect the drive conditions.

When it is desired to double a rated current performance as a whole by selecting first transistor 4 and second transistor 5 having equal rated currents, there is a problem of unbalance of main currents due to the difference in the characteristics of the respective transistors, drive conditions for the transistors, and impedances of current paths for the transistors. The switching circuit according to this embodiment is capable of adjusting and balancing the drive conditions among the factors listed above. Furthermore, second source terminal SS1 of first transistor 4 and second source terminal SS2 of second transistor 5 do not have a common impedance and are connected at the connection portions with the negative electrode terminal of drive power supply 1, and thus independently have impedances represented by parasitic impedances referred to as Lss1 and Lss2, respectively, as illustrated in FIG. 1. If it is possible to design a wiring pattern in which Lss1 and Lss2 are equally Lss, even when there is a difference between parasitic impedances Lg1 and Lg2 present on the drive paths for respective first transistor 4 and second transistor 5, the difference is the difference between Lg1+Lss and Lg2+Lss as a whole. Thus, it is possible to reduce the influence of the main currents.

Although first transistor 4 and second transistor 5 have substantially equal rated currents, it is to be noted that these transistors may be transistors of the same product model manufactured by the same manufacturer so that these transistors have substantially the same characteristics. If different transistors are used, transistors having equal characteristics such as an ON resistance and a gate threshold voltage may be selected.

By designing a wiring pattern such that the source paths in which gate drive currents flow are branched from main current paths, and the respective source paths are independent before the connection portions with the negative electrode terminal of drive power supply 1 and the ground terminal of drive circuit 3, it is possible to remove the influence of the main currents and reduce the difference in the parasitic impedance of the entire gate drive paths. Thus, it is possible to reduce the differences in drive conditions which cause unbalance of the main currents, and balance the main currents.

It is to be noted that inductances Lg1 to Lss2 as parasitic impedances as illustrated in FIG. 1 are omitted for simplicity in the following descriptions in the embodiments and the drawings.

Embodiment 2

Figure 2:
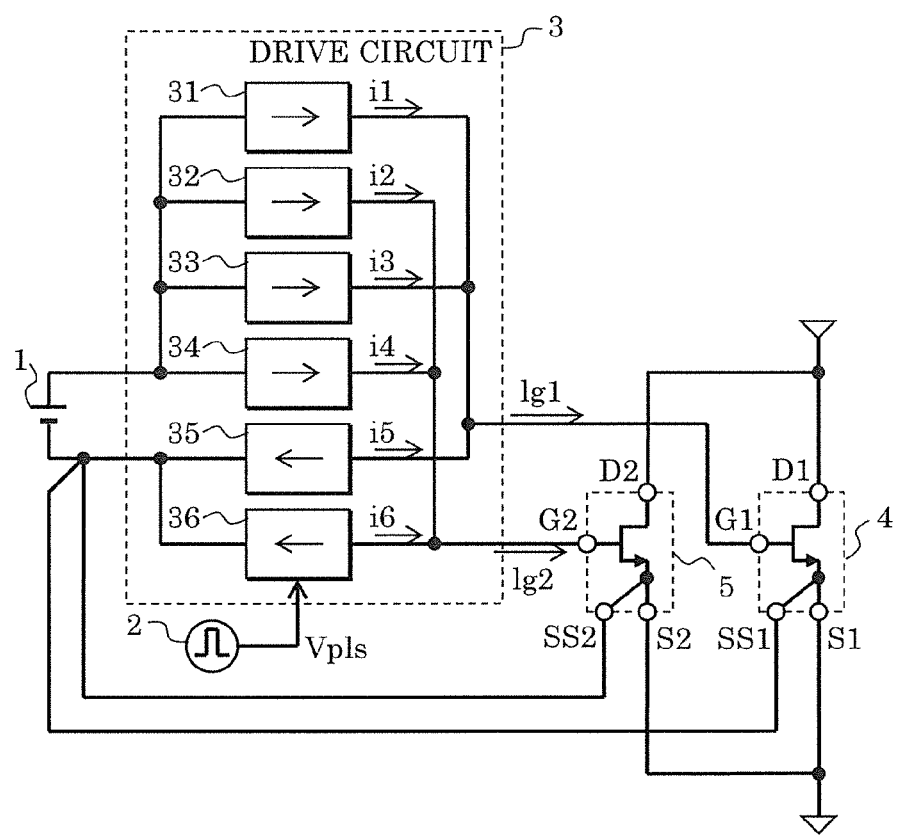
FIG. 2 is a diagram illustrating an example of a configuration of a switching circuit according to Embodiment 2.

FIG. 2 is a diagram illustrating an example of a configuration of a switching circuit according to Embodiment 2.

In FIG. 2, drive circuit 3 includes first ON circuit 31, second ON circuit 32, first turn-ON circuit 33, second turn-ON circuit 34, first turn-OFF circuit 35, and second turn-OFF circuit 36.

First ON circuit 31 supplies ON drive current i1 to gate terminal G1 of first transistor 4 according to drive pulse signal Vpls from drive signal source 2. Second ON circuit 32 supplies ON drive current i2 to gate terminal G2 of second transistor 5 according to drive pulse signal Vpls.

First turn-ON circuit 33 supplies turn-ON drive current i3 to gate terminal G1 of first transistor 4 according to drive pulse signal Vpls. Second turn-ON circuit 34 supplies turn-ON drive current i4 to gate terminal G2 of second transistor 5 according to drive pulse signal Vpls.

First turn-OFF circuit 35 supplies turn-OFF drive current i5 to gate terminal G1 of first transistor 4 according to drive pulse signal Vpls. Second turn-OFF circuit 36 supplies turn-OFF drive current i6 to gate terminal G2 of second transistor 5 according to drive pulse signal Vpls.

Figure 3:
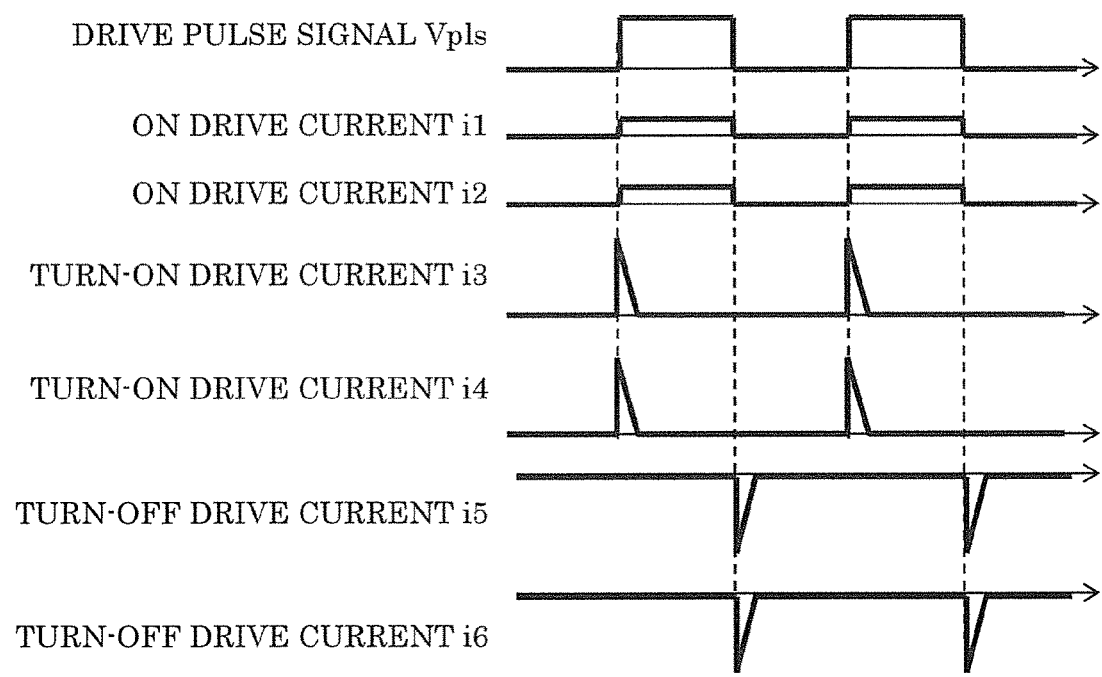
FIG. 3 is a timing chart of operations performed by the switching circuit according to Embodiment 2.

FIG. 3 is a timing chart of operations performed by a switching circuit according to Embodiment 2. FIG. 3 illustrates the respective waveforms of drive pulse signal Vpls from drive signal source 2, ON drive current i1, ON drive current i2, turn-ON drive current i3, turn-ON drive current i4, turn-OFF drive current i5, and turn-OFF drive current i6. Hereinafter, operations performed by the switching circuit according to Embodiment 2 illustrated in FIG. 2 are explained with reference to FIG. 3.

First ON circuit 31 and second ON circuit 32 supply direct currents for maintaining the ON states of transistors while drive pulse signal Vpls from drive signal source 2 instructs ON of the transistors, that is, during a period in which drive pulse signal Vpls is set to high level "H". When these transistors are bipolar transistors for example, these currents have values obtained by dividing main currents by a current amplification rate hfe (approximately 10 in the case of electric power switching), and range from several milli-amperes to several tens of milli-amperes when these transistors are GaN-GITs. In the case of MOSFETs of a voltage driven type, each of these current has a value obtained by dividing a necessary gate voltage by a gate-source resistance.

First turn-ON circuits 33 and second turn-ON circuit 34 supply surge currents for charging the gate voltages up to a threshold value or above rapidly when drive pulse signal Vpls from drive signal source 2 instructs turning on of the transistors, that is, during a period from when drive pulse signal Vpls is set to "H". The peak value is set to be approximately double the value obtained by dividing a product of a gate input capacitance and a threshold voltage by turn-ON delay time (delay time from when drive pulse signal Vpls rises to when turning on is actually performed. Although the peak value of the current depends on electric power handled by the switching circuit, the peak value is several millions of milli-ampere in the case of bipolar transistors, and from 1 A to 2 A in the case of MOSFETs.

First turn-OFF circuit 35 and second turn-OFF circuit 36 supply surge currents for releasing the gate voltages down to a threshold value or below rapidly when drive pulse signal Vpls from drive signal source 2 instructs turning off of the transistors, that is, during a period from when drive pulse signal Vpls is set to "L". The absolute value of the peak value is set to be greater than or equal to a turn-ON drive current.

As described above, in the same manner as in Embodiment 1 in which a difference in parasitic impedance is reduced by branching the source paths and dividing lines so as not to have a common impedance, it is possible to adjust main currents that flow in the respective transistors and alternatively to balance main currents when these transistors are operating in parallel by forming three divided gate drive paths per transistor according to an application thereof so that these paths can be adjusted separately.

Although it has been described that the first and second ON circuits supply ON drive currents to maintain the ON states, it is to be noted that such supply of ON drive currents may be unnecessary when these transistors are MOSFETs. This is because, when MOSFETs have sufficiently large gate-source parasitic capacitances and sufficiently high switching frequencies, the gate voltages decrease less, and thus it is possible to maintain the ON states even without any ON drive currents. In other words, the drive circuits according to this embodiment are suitable for transistors which require currents to be supplied to gate terminals in order to be kept in ON states.

Embodiment 3

Figure 4:
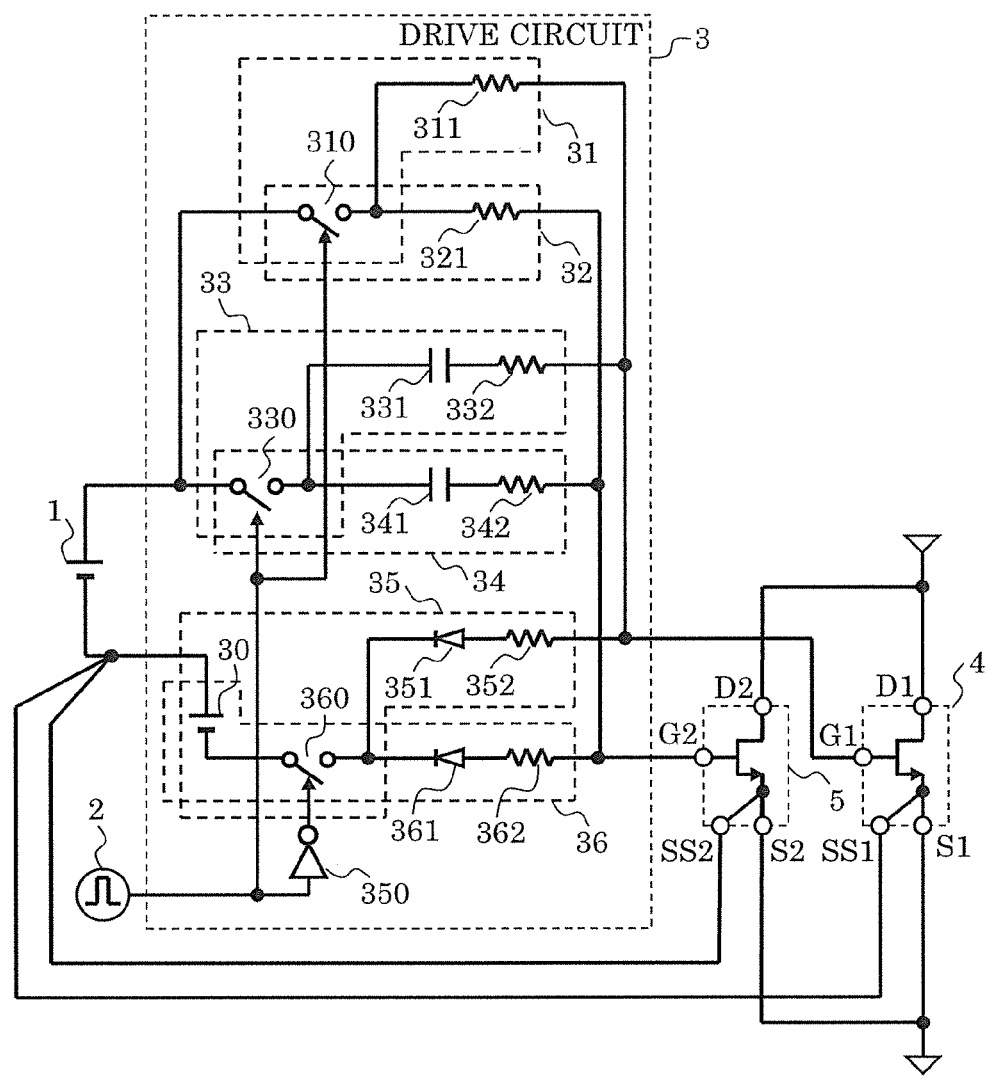
FIG. 4 is a diagram illustrating an example of a configuration of a switching circuit according to Embodiment 3.

FIG. 4 is a diagram illustrating an example of a configuration of a switching circuit according to Embodiment 3. FIG. 4 is a diagram illustrating a more specific example of a circuit configuration than the circuit configuration of the switching circuit in FIG. 2 indicated in Embodiment 2.

In FIG. 4, drive circuit 3 includes first ON circuit 31, second ON circuit 32, first turn-ON circuit 33, second turn-ON circuit 34, first turn-OFF circuit 35, and inverter 350.

First ON circuit 31 includes a series circuit including first switch 310 and first ON drive resistor 311. One of the ends of first switch 310 is connected to the positive electrode terminal of drive power supply 1 and the other end is connected to first ON drive resistor 311. One of the ends of first ON drive resistor 311 is connected to first switch 310 and the other end of first ON drive resistor 311 is connected to gate terminal G1 of first resistor 4. First switch 310 is shared by first ON circuit 31 and second ON circuit 32, and turns on and off according to drive pulse signal Vpls from drive signal source 2.

With this configuration, first ON circuit 31 supplies, as part of a first drive signal, ON drive current i1 which is a predetermined direct current from the positive electrode terminal of drive power supply 1 to gate terminal G1 of first transistor 4, during a period in which drive pulse signal Vpls instructs ON states of first transistor 4 and second transistor 5. The period in which the ON states are instructed is, for example, a period in which drive pulse signal Vpls is set to high level "H".

Second ON circuit 32 includes a series circuit including first switch 310 and second ON drive resistor 321. One of the ends of first switch 310 is connected to the positive electrode terminal of drive power supply 1, and the other end of first switch 310 is connected to second ON-drive resistor 321. One of the ends of second ON drive resistors 321 is connected to first switch 310 and the other end of second ON drive resistors 321 is connected to gate terminal G2 of second resistor 5.

With this configuration, second ON circuit 32 supplies, as part of a second drive signal, ON drive current i2 which is a predetermined direct current from the positive electrode terminal of drive power supply 1 to gate terminal G2 of second transistor 5, during a period in which drive pulse signal Vpls instructs ON states of first transistor 4 and second transistor 5.

First turn-ON circuit 33 includes a series circuit including second switch 330, first capacitor 331, and first turn-ON drive resistor 332. One of the ends of second switch 330 is connected to the positive electrode terminal of drive power supply 1, and the other end of second switch 330 is connected to first capacitor 331. One of the ends of first capacitor 331 is connected to second switch 330, and the other end of first capacitor 331 is connected to first turn-ON drive resistor 332. One of the ends of first turn-ON drive resistor 332 is connected to first capacitor 331, and the other end of first turn-ON drive resistor 332 is connected to gate terminal G1 of first transistor 4. Second switch 330 is shared by first turn-ON circuit 33 and second turn-ON circuit 34, and turns on and off according to drive pulse signal Vpls from drive signal source 2. With this configuration, first turn-ON circuit 33 supplies, as part of first drive signal, predetermined turn-ON current i3 from the positive electrode terminal of drive power supply 1 to gate terminal G1 of first transistor 4, when drive pulse signal Vpls instructs turning on of first transistor 4 and second transistor 5. Here, when the turning on of first transistor 4 and second transistor 5 is instructed is timing corresponding to each of rise edges of drive pulse signal Vpls in FIG. 3.

Second turn-ON circuit 34 includes a series circuit including second switch 330, second capacitor 341, and second turn-ON drive resistor 342. One of the ends of second switch 330 is connected to the positive electrode terminal of drive power supply 1, and the other end of second switch 330 is connected to second capacitor 341. One of the ends of second capacitor 341 is connected to second switch 330, and the other end of second capacitor 341 is connected to second turn-ON drive resistor 342. One of the ends of second turn-ON drive resistor 342 is connected to second capacitor 341, and the other end of second turn-ON drive resistor 342 is connected to gate terminal G2 of second transistor 5. With this configuration, second turn-ON circuit 34 supplies, as part of second drive signal, predetermined turn-ON current i4 from the positive electrode terminal of drive power supply 1 to gate terminal G2 of second transistor 5, while drive pulse signal Vpls instructs turning on of first transistor 4 and second transistor 5.

First turn-OFF circuit 35 includes a series circuit including negative drive power supply 30, third switch 360, first diode 351, and first turn-OFF drive resistor 352. One of the ends of third switch 360 is connected to the negative electrode terminal of negative drive power supply 30, and the other end of third switch 360 is connected to the cathode of first diode 351. The cathode of first diode 351 is connected to third switch 360, and the anode of first diode 351 is connected to first turn-OFF drive resistor 352. One of the ends of first turn-OFF drive resistor 352 is connected to the anode of first diode 351, and the other end of first turn-OFF drive resistor 352 is connected to gate terminal G1 of first transistor 4. Negative drive power supply 30 and third switch 360 are shared by first turn-OFF circuit 35 and second turn-OFF circuit 36. Negative drive power supply 30 outputs a voltage −Vee. The positive electrode of negative drive power supply 30 is connected to the negative electrode of drive power supply 1, and the negative electrode of negative drive power supply 30 is connected to third switch 360. Third switch 360 turns on and off according to inverted drive pulse signal Vpls from inverter 350.

With this configuration, first turn-OFF circuit 35 draws, as part of first drive signal, predetermined turn-OFF drive current i5 from gate terminal G1 of first transistor 4 when drive pulse signal Vpls instructs turning off of first transistor 4 and second transistor 5. Here, when the turning off of first transistor 4 and second transistor 5 is instructed is timing corresponding to each of fall edges of drive pulse signal Vpls in FIG. 3.

Second turn-OFF circuit 36 includes a series circuit including negative drive power supply 30, third switch 360, second diode 361, and second turn-OFF drive resistor 362. One of the ends of third switch 360 is connected to the negative electrode terminal of negative drive power supply 30, and the other end of third switch 360 is connected to the cathode of second diode 361. The cathode of second diode 361 is connected to third switch 360, and the anode of second diode 361 is connected to second turn-OFF drive resistor 362. One of the ends of second turn-OFF drive resistor 362 is connected to the anode of second diode 361, and the other end of second turn-OFF drive resistor 362 is connected to gate terminal G2 of second transistor 5.

With this configuration, second turn-OFF circuit 36 draws, as part of second drive signal, predetermined turn-OFF drive current i6 from gate terminal G2 of second transistor 5 while drive pulse signal Vpls instructs turning off of first transistor 4 and second transistor 5.

First ON circuit 31, first turn-ON circuit 33, and first turn-OFF circuit 35 supply a first drive signal to gate terminal G1 of first transistor 4. In other words, first drive signal is a signal obtained by synthesizing ON drive current i1, turn-ON drive current i3, and turn-OFF drive current i5. In addition, second ON circuit 32, second turn-ON circuit 34, and second turn-OFF circuit 36 supply a second drive signal to gate terminal G2 of second transistor 5. In other words, second drive signal is a signal obtained by synthesizing turn-ON drive current i2, turn-ON drive current i4, and turn-OFF drive current i6.

Subsequently, more specific operations performed by drive circuit 3 are described.

First, in first ON circuit 31 and second ON circuit 32, ON drive currents i1 and i2 are represented according to the following expressions where: an ON voltage of first switch 310 is ignored; the resistance values of first ON drive resistor 311 and second ON drive resistor 321 are assumed to be R311 and R321, respectively; and the gate voltages of the first and second transistors when the first and second transistors are ON are assumed to be Vg1 and Vg2, respectively.

$$i1=(Vcc-Vg1)/R311$$

$$i2=(Vcc-Vg2)/R321$$

When first transistor 4 and second transistor 5 are bipolar transistors or GaN-GITs having the same specifications, Vg1 is substantially equal to Vg2. It is possible to equalize the levels of main currents when first and second transistors 4 and 5 are ON by substantially equalizing resistance values of respective first and second ON drive resistors 311 and 321 so that i1 is nearly equal to i2. In other words, even in the case of transistors having different gate voltages when the transistors are ON, it is possible to substantially equalize the levels of main currents when the transistors are ON by adjusting either one or both of the resistance values of first and second ON drive resistors 311 and 321 so that i1 is nearly equal to i2.

Subsequently, in first turn-ON circuit 33 and second turn-ON circuit 34, turn-ON drive currents i3 and i4 are represented by the following expressions where: the gate input capacitances of the first and second transistors are assumed to be Cg1 and Cg2, respectively; an ON voltage of second switch 330 is ignored; the capacitances of first capacitor 331 and second capacitor 341 are assumed to be C331 and C341, respectively; initial voltage values at turn-on time of C331 and C341 are assumed to be voltage values obtained according to (Vcc−Vg1) and (Vcc−Vg2) at the end time of the ON period in the immediately previous cycle; the resistance values of first turn-ON drive resistor 332 and second turn-ON drive resistor 342 are assumed to be R332 and R342, respectively, and thus both of the gate voltages of the first and second transistors immediately before turning on are negative voltages −Vee.

$$i3=\{(Vg1+Vee)/R332\}*\exp\{-t/(C3*R332)\}$$

$$i4=\{(Vg2+Vee)/R342\}*\exp\{-t/(C4*R342)\}$$

Here, C3 and C4 are represented according to the expressions below.

$$C3=Cg1*C331/(Cg1+C331)$$

$$C4=Cg2*C341/(Cg2+C341)$$

When the first and second transistors are one of bipolar transistors having the same specifications and GaN-GITs, Vg1 is nearly equal to Vg2, and Cg1 is nearly equal to Cg2. By equalizing the static capacitances of respective first and second capacitors 331 and 341 and the resistance values of first and second turn-ON drive resistors 332 and 342, turn-ON drive current i3 is substantially equal to turn-ON drive current i4 and the gate voltages are also substantially equalized, and it is possible to approximately equalize the levels of main currents at a turn-ON time.

Furthermore, in first turn-OFF circuit 35 and second turn-OFF circuit 36, turn-OFF drive currents i5 and i6 are represented by the following expressions where: an ON voltage of third switch 360, voltage falls in the forward direction of first diode 351 and second diode 361 are ignored; and resistance values of first turn-OFF drive resistor 352 and second turn-OFF drive resistor 362 are assumed to be R352 and R362, respectively, and thus both of the gate voltages of first and second transistors immediately before turning off are negative voltages −Vee.

$$i5=-\{(Vg1+Vee)/R352\}*\exp\{-t/(Cg1*R352)\}$$

$$i6=-\{(Vg2+Vee)/R362\}*\exp\{-t/(Cg2*R362)\}$$

When the first and second transistors are one of bipolar transistors having the same specifications and GaN-GITs, Vg1 is nearly equal to Vg2, and Cg1 is substantially equal to Cg2. Thus, when the resistance values of first and second turn-OFF drive resistors 352 and 362 are equalized, turn-OFF drive current i5 is nearly equal to turn-OFF drive current i6, the gate voltages are also equalized. In this way, it is possible to substantially equalize the levels of main currents at a turn-OFF time.

In addition, first diode 351 and second diode 361 prevent flow of a feedback current by short-circuiting gate drive paths divided in the ON circuit and the turn-ON circuit at first and second turn-OFF drive resistors 352 and 362.

As described above, the switching circuit according to this embodiment includes: drive power supply 1 which has a positive electrode terminal and a negative electrode terminal, and outputs predetermined drive voltage Vcc; first transistor 4 and second transistor 5 which are connected in parallel; drive signal source 2 which outputs drive pulse signal Vpls for performing ON and OFF drive of first transistor 4 and second transistor 5; drive circuit 3 which receives electric power from drive power supply 1, and outputs a first drive signal for performing ON and OFF drive of first transistor 4 and a second drive signal for performing ON and OFF drive of second transistor 5.

First transistor 4 and second transistor 5 include drain terminal D1 and drain terminal D2, respectively, and source terminal S1 and source terminal S2, respectively, to each of which a main current flows when a corresponding one of first transistor 4 and second transistor 5 is ON, and include gate terminal G1 and gate terminal G2, respectively, each of which changes an impedance between the drain terminal and the source terminal according to a corresponding one of the first drive signal and the second drive signal.

Drain terminal D1 of first transistor 4 and drain terminal D2 of second transistor 5 are connected, and source terminal S1 of first transistor 4 and source terminal S2 of second transistor 5 are connected. Gate terminal G1 of first transistor 4 receives first drive signal, and gate terminal G2 of second transistor 5 receives second drive signal.

Drive circuit 3 includes: first ON circuit 31; second ON circuit 32; first turn-ON circuit 33; second turn-ON circuit 34; first turn-OFF circuit 35; and second turn-OFF circuit 36.

First ON circuit 31 supplies, as part of first drive signal, a first ON drive current which is a predetermined direct current from the positive electrode terminal of drive power supply 1 to gate terminal G1 of first transistor 4 while drive pulse signal Vpls instructs ON states of the first and second transistors.

Second ON circuit 32 supplies, as part of second drive signal, a second ON drive current which is a predetermined direct current from the positive electrode terminal of drive power supply 1 to gate terminal G2 of second transistor 5 while drive pulse signal Vpls instructs ON states of the first and second transistors.

First turn-ON circuit 33 supplies, as part of the first drive signal, a first predetermined turn-ON drive current from the positive electrode terminal of drive power supply 1 to gate terminal G1 of first transistor 4 while drive pulse signal Vpls instructs turning on of first and second transistors.

Second turn-ON circuit 34 supplies, as part of the second drive signal, a second predetermined turn-ON drive current from the positive electrode terminal of drive power supply 1 to gate terminal G2 of second transistor 5 while drive pulse signal Vpls instructs turning on of first and second transistors.

First turn-OFF circuit 35 draws, part of the first drive signal, a first predetermined turn-OFF drive current from gate terminal G1 of first transistor 4 while drive pulse signal Vpls instructs turning off of the first and second transistors.

Second turn-OFF circuit 36 draws, part of the second drive signal, a second predetermined turn-OFF drive current from gate terminal G2 of second transistor 5 while drive pulse signal Vpls instructs turning off of the first and second transistors. It should be noted that first transistor 4 and second transistor 5 may be transistors which require currents to be supplied to gate terminals G1 and G2 in order to be kept in an ON state.

In addition, first transistor 4 and second transistor 5 may have substantially equal rated currents. Drive circuit 3 may be configured such that ON drive current i1 in first ON circuit 31 and ON drive current i2 in second ON circuit 32 are set to be substantially equal to each other. Turn-ON drive current i3 in first turn-ON circuit 33 and turn-ON drive current i4 in second turn-ON circuit 34 may be set to be substantially equal to each other. Turn-OFF drive current i5 in first turn-OFF circuit 35 and turn-OFF drive current i6 in second turn-OFF circuit 36 may be set to be substantially equal to each other.

Although the ON voltages of second switch 330 and third switch 360 are ignored in this embodiment, it is possible to reduce first and second turn-ON drive resistors 332 and 342 by adjusting the ON resistance of second switch 330 and to reduce first and second turn-OFF drive resistors 352 and 362 by adjusting the ON resistance of third switch 360.

Embodiment 4

Embodiments 1 to 3 disclose configurations of drive circuits of transistors which operate in parallel. It is possible to adjust and balance the direct current levels of main currents under some drive conditions such as parameter setting and a wiring method for the drive circuits. In order to balance such main currents at transition times such as turning on and off of transistors, particularly important things include arrangement of components including an alternating current source and a way of designing a wiring pattern of lines in which main currents flow.

Figure 5:
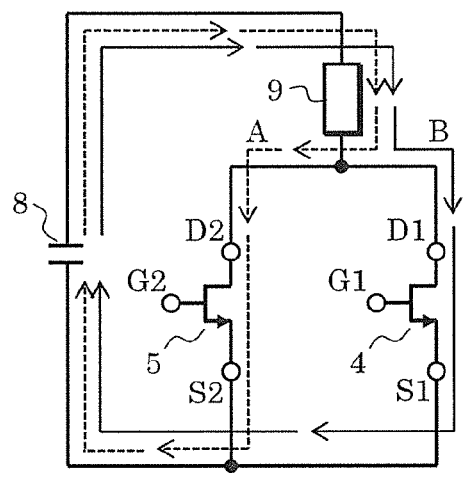
FIG. 5 is a diagram illustrating a switching circuit and a load and current paths for the same according to Embodiment 4.
Figure 6:
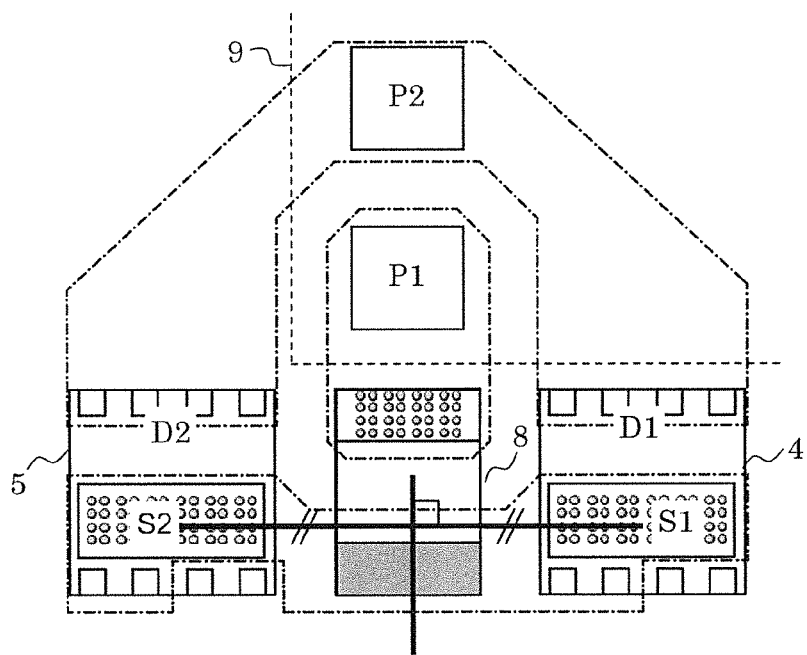
FIG. 6 is a plan view of an example of mounting the switching circuit according to Embodiment 4 onto a wiring board.

FIG. 5 is a diagram illustrating a switching circuit and a load and current paths for the same according to Embodiment 3 of the present disclosure. FIG. 6 is a plan view illustrating an example of mounting the switching circuit onto wiring board 10. It is to be noted that, in FIG. 6, areas enclosed by alternate long and short dash lines illustrate a wiring conductor (this holds true for the other diagrams). In FIGS. 5 and 6, first transistor 4 and second transistor 5 are connected in parallel with the same rated current. A drive circuit connected to a gate terminal and a second source terminal is the same as in Embodiments 1 to 3, and thus is not described in the following embodiments together with a second source terminal. Bypass capacitor 8 which becomes an alternating current source of each transistor has a negative electrode terminal connected to first transistor 4 and each of first source terminals S1 and S2 of second transistor 5, and a positive electrode terminal connected to load 9. The other end of load 9 is connected to each of drain terminals of first transistor 4 and second transistor 5. Load 9 corresponds to a primary winding of a transducer in a switching power supply. In FIG. 6, terminals P1 and P2 are defined assuming the primary winding of the transducer as load 9. Terminal P1 of load 9 is connected to the positive electrode terminal of bypass capacitor 8, and terminal P2 of load 9 and drain terminals D1 and D2 of respective first and second transistors are connected.

In FIG. 5, loop A indicated by a broken arrow connects bypass capacitor 8, load 9, first transistor 4, and bypass capacitor 8 in this sequence, and loop B indicated by a solid arrow connects bypass capacitor 8, load 9, second transistor 5, and bypass capacitor 8 in this sequence. It is possible to reduce a difference in main currents at transition times by substantially equalizing impedances of loop A and loop B.

In order to substantially equalize impedances in loop A and loop B, in FIG. 6, bypass capacitor 8 is arranged such that a perpendicular bisector that connects source terminal S1 of first transistor 4 and source terminal S2 of second transistor 5 passes through the negative electrode terminal of bypass capacitor 8, and first source terminal S1 of first transistor 4 and a wiring conductor from first source terminal S2 of second transistor 5 is connected by the negative electrode terminal of bypass capacitor 8.

As described above, the switching circuit according to this embodiment includes bypass capacitor 8 which is the alternating current source of first transistor 4 and second transistor 5. First transistor 4, second transistor 5, and bypass capacitor 8 are connected such that main currents flow from load 9 to the negative electrode terminal of bypass capacitor 8 via first transistor 4 and second transistor 5. First transistor 4, second transistor 5, and bypass capacitor 8 are connected on a wiring board so as to equalize an impedance between first source terminal S1 of first transistor 4 and the negative electrode terminal of bypass capacitor 8 and an impedance between first source terminal S2 of second transistor 5 and the negative electrode terminal of bypass capacitor 8.

Furthermore, in the switching circuit, first transistor 4, second transistor 5, and bypass capacitor 8 are arranged on wiring board 10 such that the perpendicular bisector that connects source terminal S1 of first transistor 4 and source terminal S2 of second transistor 5 passes through the negative electrode terminal of bypass capacitor 8 in a plan view of wiring board 10.

By configuring the switching circuit as described above, impedances including parasitic inductances from the negative electrode terminal of bypass capacitor 8 to the first source terminals of the first and second transistors are approximately equal to each other. Accordingly, main currents that flow at transition times such as turning on and off of the switching circuit are balanced between the first and second transistors.

Embodiment 5

Figure 7:
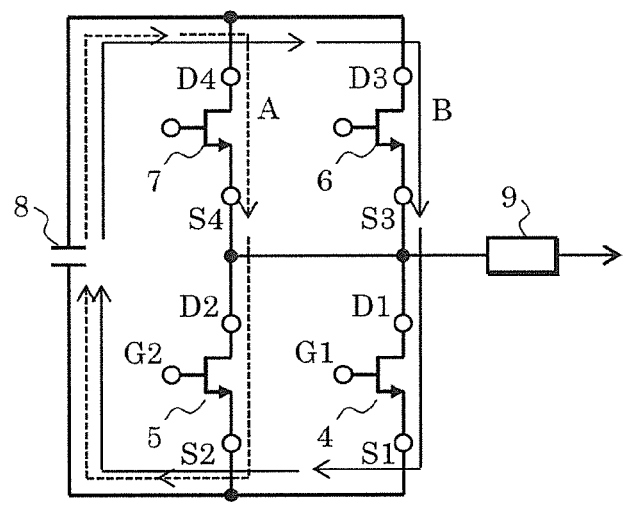
FIG. 7 is a diagram illustrating a configuration example of a switching circuit having a half bridge configuration according to Embodiment 5.
Figure 8:
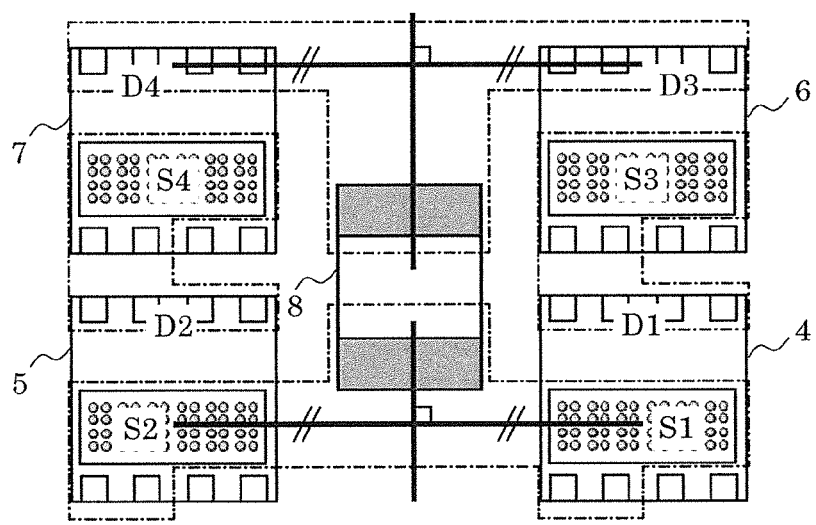
FIG. 8 is a plan view of an example of mounting the switching circuit according to Embodiment 5 onto a wiring board.

FIG. 7 is a diagram illustrating a configuration example of a switching circuit having a half bridge configuration according to Embodiment 5. FIG. 8 is a plan view of an example of mounting the switching circuit onto a wiring board. In FIGS. 7 and 8, first transistor 4 and second transistor 5 are connected in parallel in a low-side switch, and third transistor 6 and fourth transistor 7 are connected in parallel in a high-side switch. Bypass capacitor 8 which becomes an alternating current source of each transistor is configured such that the source terminals of respective first transistor 4 and second transistor 5 in the low-side switch and the negative electrode terminal are connected, and that the drain terminals of respective third transistor 6 and fourth transistor 7 in the high-side switch and the positive electrode terminal are connected. Load 9 is connected to the connection portions of the high-side switch and the low-side switch.

In FIG. 7, loop A indicated by a broken arrow connects bypass capacitor 8, third transistor 6, first transistor 4, and bypass capacitor 8 in this sequence, and loop B indicated by a solid arrow connects bypass capacitor 8, fourth transistor 7, second transistor 5, and bypass capacitor 8 in this sequence. It is possible to reduce a difference in main currents at transition times by substantially equalizing impedances of loop A and loop B.

In order to substantially equalize impedances in loop A and loop B, as illustrated in FIG. 8, bypass capacitor 8 is arranged such that the perpendicular bisector that connects source terminal S1 of first transistor 4 and source terminal S2 of second transistor 5 passes through the negative electrode terminal of bypass capacitor 8 and the perpendicular bisector that connects drain terminal D3 of third transistor 6 and drain terminal D4 of fourth transistor 7 passes through the positive electrode terminal of bypass capacitor 8. In this way, a wiring conductor from source terminal S1 of first transistor 4 and source terminal S2 of second transistor 5 is connected by the negative electrode terminal of bypass capacitor 8, and a wiring conductor from drain terminal D3 of third transistor 6 and drain terminal D4 of fourth transistor 7 is connected by the positive electrode terminal of bypass capacitor 8.

As described above, the switching circuit according to this embodiment further includes third transistor 6 and fourth transistor 7, compared to the switching circuit in FIG. 5 as illustrated in FIG. 7. Third transistor 6 and fourth transistor 7 include drain terminals D3 and D4 and first source terminals S3 and S4, respectively, to each of which a main current flows. Drain terminal D3 of third transistor 6, drain terminal D4 of fourth transistor 7, and the positive electrode terminal of bypass capacitor 8 are connected on wiring board 10. In addition, drain terminal D1 of first transistor 4, drain terminal D2 of second transistor 5, source terminal S3 of third transistor 6, and source terminal S4 of fourth transistor 7 are connected. Third transistor 6, fourth transistor 7, and bypass capacitor 8 are arranged as illustrated in FIG. 8 such that the perpendicular bisector of the line segment to connect drain terminal D3 of third transistor 6 and drain terminal D4 of fourth transistor 7 passes through the positive electrode terminal of bypass capacitor 8 in a plan view of wiring board 10.

With the above-described configuration, impedances including parasitic inductances from the negative electrode terminal of bypass capacitor 8 to the first source terminals of the first and second transistors are approximately equal to each other, and impedances including parasitic inductances from the positive electrode terminal of bypass capacitor 8 to the drain terminals of the third and fourth transistors are approximately equal to each other. Accordingly, main currents that flow at transition times such as turning on and off of the switching circuit are balanced between the first and second transistors and between the third and fourth transistors.

Embodiment 6

Figure 9A:
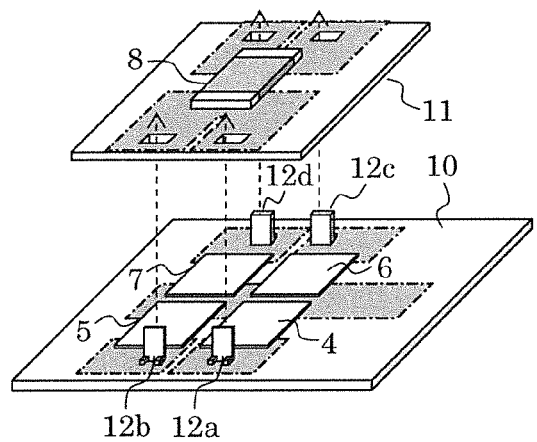
FIG. 9A is a perspective view of mounting a switching circuit according to Embodiment 6 onto a wiring board and a sub wiring board.
Figure 9B:
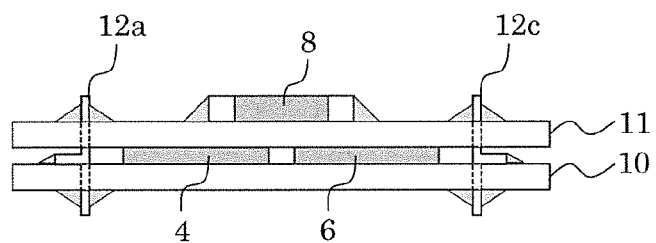
FIG. 9B is a perspective view of mounting the switching circuit according to Embodiment 6 onto the wiring board and the sub wiring board.

FIG. 9A is a perspective view of mounting a switching circuit according to Embodiment 6 onto a wiring board and a sub wiring board. FIG. 9B is a side view of the same. The switching circuit according to this embodiment includes: wiring board 10 and sub wiring board 11. Wiring board 10a includes the following arranged thereon: a low-side switch including first transistor 4 and second transistor 5 which are connected in parallel; a high-side switch including third transistor 6 and fourth transistor 7 which are connected in parallel; first connector 12a connected in the proximity of a first source terminal of first transistor 4; second connector 12b connected in the proximity of a first source terminal of second transistor 5; third connector 12c connected in the proximity of the drain terminal of third transistor 6; and fourth connector 12d connected in the proximity of the drain terminal of fourth transistor 7. Sub wiring board 11 includes bypass capacitor 8 which is arranged thereon and becomes an alternating current source of transistors. Sub wiring board 11 is connected to wiring board 10 via first to fourth connectors 12a to 12d.

Figure 9C:
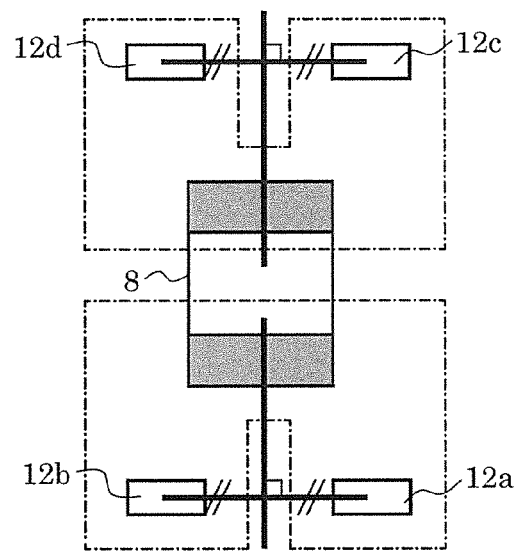
FIG. 9C is a perspective view of mounting the switching circuit according to Embodiment 6 onto the sub wiring board.
Figure 10:
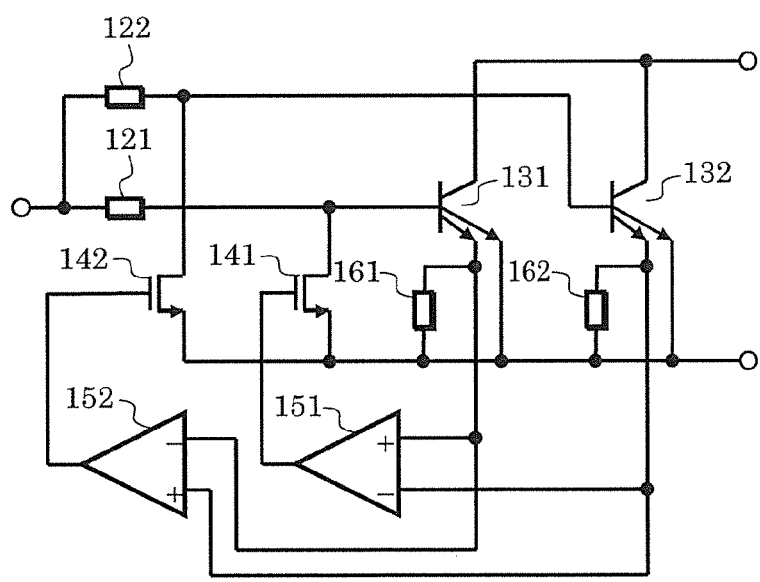
FIG. 10 is a circuit diagram of a switching circuit described in Patent Literature 1.

FIG. 9C is a perspective view of mounting the switching circuit according to Embodiment 6 onto the sub wiring board. In the plan view of wiring board 10, on sub wiring board 11, bypass capacitor 8 is arranged such that: a perpendicular bisector of a line segment to connect first connector 12a and second connector 12b passes through the negative electrode terminal of bypass capacitor 8, a perpendicular bisector of a line segment to connect third connector 12c and fourth connector 12d passes through the positive electrode terminal of bypass capacitor 8; a wiring conductor from first connector 12a and second connector 12b are connected by the negative electrode terminal of bypass capacitor 8; and a wiring conductor from third connector 12c and fourth connector 12d are connected by the positive electrode terminal of bypass capacitor 8.

As described above, the switching circuit according to this embodiment includes wiring board 10 as illustrated in FIGS. 9A, 9B, and 9C and sub wiring board 11. Wiring board 10 includes the following arranged thereon: first connector 12a connected to source terminal S1 of first transistor 4 in the proximity of first transistor 4; and second connector 12b connected to source terminal S2 of second transistor 5 in the proximity of second transistor 5. Wiring board 11 includes bypass capacitor 8 arranged thereon and connected to wiring board 10 on first transistor and second transistor by first connector 12a and second connector 12b. First connector 12a, second connector 12b, and bypass capacitor 8 are arranged on sub wiring board 11 such that the perpendicular bisector of the line segment to connect first connector 12a and second connector 12b passes through the negative electrode terminal of bypass capacitor 8 in a plan view of wiring board 10.

In addition, the switching circuit further includes third transistor 6 and fourth transistor 7. Third transistor 6 and fourth transistor 7 include drain terminals D3 and D4 and first source terminals S3 and S4, respectively, to each of which a main current flows. The switching circuit includes: third connector 12c connected to drain terminal D3 of third transistor 6, in the proximity of third transistor 6 arranged on wiring board 10; and fourth connector 12d connected to drain terminal D4 of fourth transistor 7, in the proximity of fourth transistor 7 arranged on wiring board 10. Third connector 12c and fourth connector 12d are connected to sub wiring substrate 11. Third connector 12c, fourth connector 12d, and bypass capacitor 8 are arranged on sub wiring board 11 such that the perpendicular bisector of a line segment to connect third connector 12c and fourth connector 12d passes through the positive electrode terminal of bypass capacitor 8 in a plan view of wiring board 10.

With the above-described configuration, impedances including parasitic inductances from the negative electrode terminal of bypass capacitor 8 to the first source terminals of the first and second transistors are approximately equal to each other, and impedances including parasitic inductances from the positive electrode terminal of bypass capacitor 8 to the drain terminals of the third and fourth transistors are approximately equal to each other. Accordingly, main currents that flow at transition times such as turning on and off of the switching circuit are balanced between the first and second transistors and between the third and fourth transistors. First to fourth connectors 12a, 12b, 12c, and 12d which may become factors of impedances may be made of the same material and have the same shape.

Although a solid configuration using a sub wiring board for implementing compact high-density mounting in addition to balancing main currents at transition times in Embodiment 6, it is possible to configure the sub wiring board to have additional functions. For example, the wiring conductor on the sub wiring board on which bypass capacitor 8 is mounted is comparatively stable because of having a slightly variable potential, and thus it is also possible to provide a shielding effect of reducing radiation noise.

Alternatively, it is also good to configure at least one of first to fourth transistors 4 to 7 to also function as a heat sink for releasing heat in order to apply the switching circuit in one of for larger current switching and lengthening the life by reducing increase in the temperature of the switching circuit. Other specific examples include: to form a wiring conductor on the entirety of both surfaces of sub wiring substrate 11 in order for increasing heat releasing characteristics; to use a ceramic board having a high heat releasing characteristics as sub wiring board 11; and to fill the space between the sub wring board and transistors with a material having a high heat releasing characteristics such as silicon grease.

Other Embodiments

Switching circuits according to the present disclosure have been described based on non-limiting Embodiments 1 to 6 above. The present disclosure also includes: other embodiments which can be implemented by arbitrarily combining the constituent elements of any of the above embodiments; variations which can be obtained by adding, to any of the above embodiments, various kinds of modifications that a person skilled in the art will arrive at without materially departing from the novel teachings and advantages of the present disclosure; and various kinds of apparatuses including the switching circuit according to the present disclosure.

INDUSTRIAL APPLICABILITY

The switching circuit according to the present disclosure is applicable to switching power supplies, inverters, etc.

What is claimed is:

1. A switching circuit, comprising:
a drive power supply which includes a positive electrode terminal and a negative electrode terminal, and outputs a predetermined drive voltage;
a first transistor and a second transistor which are connected in parallel;
a drive signal source which outputs a drive pulse signal for turning on and off the first transistor and the second transistor; and
a drive circuit, which includes a power supply terminal and a ground terminal, receives supply of electric power from the drive power supply, and outputs, according to the drive pulse signal, a first drive signal for turning on and off the first transistor and a second drive signal for turning on and off the second transistor,
wherein each of the first transistor and the second transistor includes:
a drain electrode and a source electrode in which a main current flows when a corresponding one of the first transistor and the second transistor is ON;
a gate electrode which changes an impedance between the drain electrode and the source electrode according to a corresponding one of the first drive signal and the second drive signal;
a gate terminal connected to the gate electrode;
a drain terminal connected to the drain electrode;
a first source terminal connected to the source electrode for passing the main current between the drain electrode and the source electrode; and
a second source terminal connected to the source electrode for detecting a source voltage and flowing a gate drive current, the second source terminal being provided in addition to the first source terminal,
the first source terminal is connected to the source electrode at an impedance lower than an impedance of the second source terminal,
the drain terminal of the first transistor and the drain terminal of the second transistor are connected to each other,
the first source terminal of the first transistor and the first source terminal of the second transistor are connected to each other,
the gate terminal of the first transistor receives the first drive signal,
the gate terminal of the second transistor receives the second drive signal, and
the second source terminal of the first transistor and the second source terminal of the second transistor are individually and separately connected to a portion of a wiring line which connects the negative electrode terminal of the drive power supply and the ground terminal of the drive circuit.

2. The switching circuit according to claim 1,
wherein the first transistor and the second transistor have substantially equal rated currents, and
the first drive signal and the second drive signal which are supplied by the drive circuit are set to be substantially the same.

3. The switching circuit according to claim 2, further comprising:
a bypass capacitor which becomes an alternating current source for the first transistor and the second transistor,
wherein the bypass capacitor, the first transistor, and the second transistor are connected for passing the main current from a load to a negative electrode terminal of the bypass capacitor through the first transistor and the second transistor, and
the first transistor, the second transistor, and the bypass capacitor are arranged on a wiring board such that an impedance between the first source terminal of the first transistor and the negative electrode terminal of the bypass capacitor and an impedance between the first source terminal of the second transistor and the negative electrode terminal of the bypass capacitor are substantially equal to each other.

4. The switching circuit according to claim 3, wherein the first transistor, the second transistor, and the bypass capacitor are arranged on the wiring board such that a perpendicular bisector of a line segment to connect the source terminal of the first transistor and the source terminal of the second transistor passes through the negative electrode terminal of the bypass capacitor in a plan view of the wiring board.

5. The switching circuit according to claim 4, further comprising:
a third transistor and a fourth transistor,
wherein each of the third transistor and the fourth transistor includes a drain terminal and a source terminal in which a main current flows,
on the wiring board,
the drain terminal of the third transistor, the drain terminal of the fourth transistor, and a positive electrode terminal of the bypass capacitor are connected to one another, the drain terminal of the first transistor, the drain terminal of the second transistor, the source terminal of the third transistor, and the source terminal of the fourth transistor are connected to one another, and the third transistor, the fourth transistor, and the bypass capacitor are arranged on the wiring board such that a perpendicular bisector of a line segment to connect the drain terminal of the third transistor and the drain terminal of the fourth transistor passes through the positive electrode terminal of the bypass capacitor in a plan view of the wiring board.

6. The switching circuit according to claim 3, further comprising:

the wiring board;

a first connector connected to the source terminal of the first transistor in a proximity of the first transistor arranged on the wiring board;

a second connector connected to the source terminal of the second transistor in a proximity of the second transistor arranged on the wiring board; and a sub wiring board which is connected to the wiring board by the first connector and the second connector on the first transistor and the second transistor, and on which the bypass capacitor is arranged, wherein the first connector, the second connector, and the bypass capacitor are arranged on the wiring board such that a perpendicular bisector of a line segment to connect the first connector and the second connector passes through the negative electrode terminal of the bypass capacitor in a plan view of the wiring board.

7. The switching circuit according to claim 6, further comprising:

a third transistor and a fourth transistor, wherein each of the third transistor and the fourth transistor includes a drain terminal and a source terminal in which a main current flows, the switching circuit further comprising:

a third connector connected to the drain terminal of the third transistor in a proximity of the third transistor arranged on the wiring board; and a fourth connector connected to the drain terminal of the fourth transistor in a proximity of the fourth transistor arranged on the wiring board, wherein the third connector and the fourth connector are connected to the sub wiring board, and the third connector, the fourth connector, and the bypass capacitor are arranged on the sub wiring board such that a perpendicular bisector of a line segment to connect the third connector and the fourth connector passes through the positive electrode terminal of the bypass capacitor in a plan view of the sub wiring board.

8. The switching circuit according to claim 6, wherein the sub wiring board also functions as a heat sink for the first transistor and the second transistor.

* * * * *